(12) United States Patent
Wey (10) Patent No.: US 6,553,212 B1
(45) Date of Patent: Apr. 22, 2003

(54) METHOD AND APPARATUS FOR IMPROVING LOOP STABILITY AND SPEED OF A POWER CONTROL LOOP

(75) Inventor: Chia-Sam Wey, Arlington, TX (US)

(73) Assignee: Nokia Networks Oy (FI)

( * ) Notice: Subject to any disclaimer, the term of this patent is extended or adjusted under 35 U.S.C. 154(b) by 0 days.

(21) Appl. No.: 09/430,938

(22) Filed: Nov. 1, 1999

(51) Int. Cl.[7] .................................................. H04B 1/04
(52) U.S. Cl. ........................ 455/126; 455/69; 455/70; 455/91; 455/127; 376/318
(58) Field of Search .................................. 455/403, 126, 455/115, 127, 232.1, 234.1, 234.2, 240.1, 241.1, 129, 281, 117, 266, 311, 390, 295, 296, 91, 119, 114; 330/279, 277, 302, 281, 284; 320/318, 803, 294

(56) References Cited

U.S. PATENT DOCUMENTS

| | | | | |
|---|---|---|---|---|
| 5,107,225 A | * | 4/1992 | Wheatley et al. | 330/279 |
| 5,175,872 A | * | 12/1992 | Borras | 455/426 |
| 5,267,262 A | * | 11/1993 | Wheatley, III | 340/7.33 |
| 5,283,536 A | | 2/1994 | Wheatley, III et al. | |
| 5,493,707 A | * | 2/1996 | Kamitani | 455/127 |
| 5,675,286 A | * | 10/1997 | Baker et al. | 330/129 |
| 5,697,074 A | * | 12/1997 | Makikallio et al. | 330/141 |
| 5,732,333 A | * | 3/1998 | Cox et al. | 330/149 |
| 5,852,770 A | | 12/1998 | Kasamatsu | |
| 6,047,171 A | * | 4/2000 | Khayrallah et al. | 455/266 |
| 6,061,575 A | * | 5/2000 | Lombardi | 455/209 |
| 6,128,498 A | * | 10/2000 | Benveniste | 455/446 |
| 6,321,072 B1 | * | 11/2001 | Cipriani et al. | 455/126 |

FOREIGN PATENT DOCUMENTS

| | | |
|---|---|---|
| EP | 0 369 135 | 5/1990 |
| GB | 2 336 484 A | 10/1999 |

OTHER PUBLICATIONS

"Graphical Analysis of High Speed Nonlinear RF Leveling Loops"; *Microwave Journal*, vol. 33, No. 12, Dec. 1990, pp. 57–80.

* cited by examiner

*Primary Examiner*—Thanh Cong Le
*Assistant Examiner*—Pablo N Tran
(74) *Attorney, Agent, or Firm*—Altera Law Group LLC (57) ABSTRACT

A method and apparatus for improving loop stability and speed of a power control loop. Adjacent channel interference in the ramp-up and ramp-down (transient) of a TDMA burst is reduced. The present invention is used in a burst when the transient response and loop speed are important in the design of the control loop. The loop bandwidth variation resulting from linear conversion power detector and PIN diode RF attenuators in the loop is reduced by reducing the upper end of the loop bandwidth and increasing the lower end of the loop bandwidth. The upper limit of the loop bandwidth determines the loop stability and the lower limit of the loop bandwidth determines the minimum speed of the loop. A reference signal is sampled and processed to set a gain of a feedback loop in the power control loop. The setting of the gain of the feedback loop using the reference signal increases the lower loop bandwidth to increase a loop speed and decreases the upper loop bandwidth to increase a loop stability for the power control loop. Accordingly, the present invention not only improves the loop stability, but also the speed of the loop.

14 Claims, 10 Drawing Sheets

METHOD AND APPARATUS FOR IMPROVING LOOP STABILITY AND SPEED OF A POWER CONTROL LOOP

BACKGROUND OF THE INVENTION

1. Field of the Invention

This invention relates in general to radio transceivers, and more particularly to a method and apparatus for improving loop stability and speed of a power control loop.

2. Description of Related Art

Cellular mobile radio provides the technology that enables everyone to communicate anywhere with anybody. This technology has created an entire industry in mobile telecommunications, which is rapidly growing and has become a backbone for business success and expanding economies.

Telecommunication devices are designed to move information from one place to another over channels, and a radio channel is an extraordinarily hostile medium on which to establish and maintain reliable communications. A channel is particularly noisy and unruly between mobile radios. If the number of channels available for all the uses of a radio system is less than the number of all possible users, then such a system is called a trunk radio system. Trunking is a process whereby users share a limited number of channels in some orderly manner.

Time division multiple access (TDMA) is one method for sharing channels. TDMA implies the use of digital voice compression techniques which allows multiple users to share a common channel on a schedule. Modern voice encoding greatly shortens the time it takes to transmit voice messages by removing most of the redundancy and silent periods in speech communications. Thus, multiple users can share the same channel during the intervening time slots. Accordingly, all users share the physical resource by having their own assigned, repeating time slot within a group of time slots called a frame. For this reason, a time slot assignment is often called a channel.

Within a single cell, mobile stations can be found at different distances from a base station. In a cellular communications system, mobile stations are dispersed at varying distances relative to a base station. Depending on the distance to the base station, the delayed time and the attenuation of an individual's mobile signal is likely to be different from the delay and attenuation of any of the other mobile stations. However, TDMA techniques rely heavily on the proper timing of transmission bursts. Thus, a base station performs measurements on the time and delay of each mobile station. The base station then commands these mobiles to modify their transmission bursts. This feature is called timing advance.

To compensate for attenuation over different distances within the cell, the base station, at the same time it is making timing adjustments on mobiles, commands the mobiles to use different power levels in such a way that the power arriving at the base station's receiver is approximately the same for each time slot. This power control is typically performed in steps of 2 dB. To perform this power measurement process, the base station gives the mobile station a list of base stations on which to perform power measurements. The mobile station performs continuous measurements on the quality and the power level of the serving cell, and of the power levels of the adjacent cells. The measurement results are put into a measurement report, which are sent back to the base station. The base station may also perform measurements on the quality and power of the link to the mobile station. If a base station discovers that a mobile station is not receiving its signal in sufficient power level for reliable downlink communication, the base station may also apply a power control on its own by transmitting power levels in each time slot.

In TDMA, transient response and loop speed are important in the design of the control loop. However, loop stability and loop speed are two contradictory design parameters in control loop theory. For example, the wider the loop bandwidth, the faster the loop speed, but the lesser the loop stability margin.

It can be seen then that there is a need for a power control loop method and apparatus which has reduced loop bandwidth variation so that loop stability and loop speed may be maximized.

SUMMARY OF THE INVENTION

To overcome the limitations in the prior art described above, and to overcome other limitations that will become apparent upon reading and understanding the present specification, the present invention discloses a method and apparatus for improving loop stability and speed of a power control loop.

The present invention solves the above-described problems by reducing adjacent channel interference in the ramp-up and ramp-down of a TDMA burst. The present invention is used when the transient response and loop speed are important in the design of control loop. The loop bandwidth variation resulting from linear conversion power detector and PIN diode RF attenuators in the loop is reduced by reducing the upper end of the loop bandwidth and increasing the lower end of the loop bandwidth. The upper limit of the loop bandwidth determines the loop stability and the lower limit of the loop bandwidth determines the minimum speed of the loop. Accordingly, the present invention not only improves the loop stability, but also the speed of the loop.

A system in accordance with the principles of the present invention includes a power control loop for reducing adjacent channel interference in a ramp-up and a ramp-down of a signal burst in a cellular communication system. The power control loop having a feedback loop controls the ramp-up and the ramp-down and has a predetermined bandwidth, wherein a reference signal is sampled and processed to set a gain of the feedback loop in the power control loop, the setting of the gain of the feedback loop using the reference signal increases a lower loop bandwidth to increase a loop speed and decreases an upper loop bandwidth to increase a loop stability for the power control loop.

Other embodiments of a system in accordance with the principles of the invention may include alternative or optional additional aspects. One such aspect of the present invention is that a power control loop includes a first amplifier for receiving an input signal and generating a power output signal in response thereto, a coupler for sampling the power output signal, a detector/linearizer circuit, coupled to the coupler, for generating a voltage signal, a comparator, coupled to the detector/linearizer circuit, for receiving the voltage signal and comparing the voltage signal to a reference signal to generate an error signal, a variable gain amplifier, coupled to the comparator, having a selectable gain, the variable gain amplifier receiving the error signal to produce a controller input signal, a gain controller, coupled to the variable gain amplifier, for ramping the gain of the variable gain amplifier by processing the reference signal and a controller, coupled to the variable gain amplifier, the controller receiving the controller input signal and generating a control signal to control attenuation of the input signal to the first amplifier, wherein the ramping of the gain of the variable gain amplifier provides a constant loop bandwidth of the power control loop without regard to the power level of the sampled power output signal.

Another aspect of the present invention is that the ramping of the gain of the variable gain amplifier causes a decrease to an upper loop bandwidth of the power control loop and an increase to a lower loop bandwidth of the power control loop.

Another aspect of the present invention is that the ramping of the gain of the variable gain amplifier lowers bandwidth variation of the power control loop to decrease adjacent channel interference.

Another aspect of the present invention is that the ramping of the gain of the variable gain amplifier is synchronized with the reference voltage.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout:

FIG. 4b illustrates the RF spectrum including the side lobes resulting from using the triangle window (Barlett window) illustrated in FIG. 4a;

FIG. 5b illustrates the RF spectrum including the side lobes resulting from using the Hanning window of FIG. 5a;

FIG. 6b illustrates the RF spectrum including the side lobes resulting from using the Blackman window of FIG. 6a;

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention reduces adjacent channel interference in the ramp-up and ramp-down (transient) of a TDMA burst. The present invention is used in a burst when the transient response and loop speed are important in the design of control loop. Loop stability and loop speed are two contradictory design parameters in control loop theory, that is, the wider the loop bandwidth, the faster the loop speed and the lesser the loop stability margin. Thus, the present invention reduces loop bandwidth variation resulting from linear conversion power detector and PIN diode RF attenuators in the loop, so the upper end of the loop bandwidth is reduced and the lower end of the loop bandwidth is increased. The upper limit of the loop bandwidth determines the loop stability and the lower limit of the loop bandwidth determines the minimum speed of the loop. Accordingly, the present invention not only improves the loop stability, but also the speed of the loop so that the bandwidth of the power control loop is not dependent upon the power level of the sampled output power signal.

Figure 1:
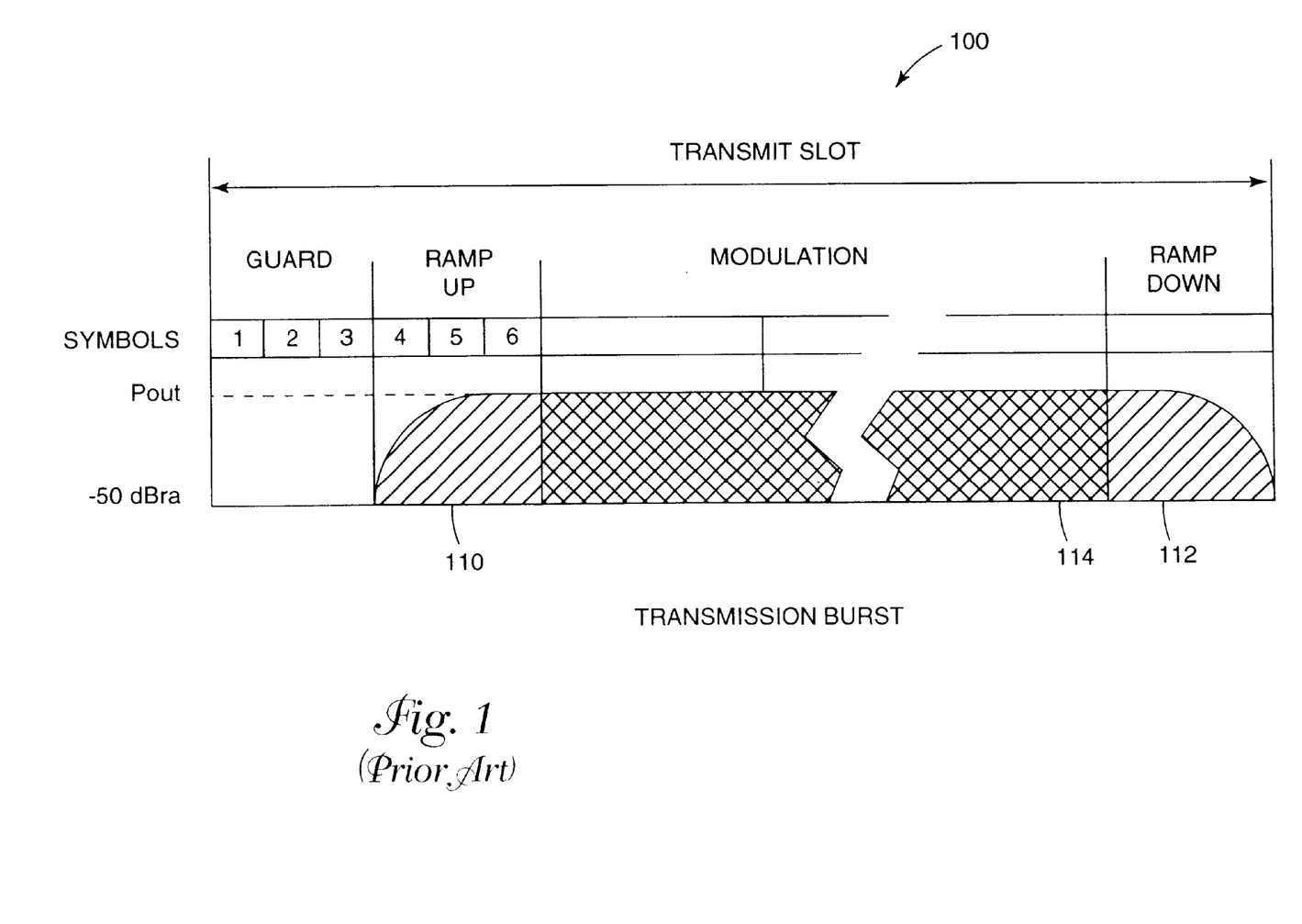
FIG. 1 illustrates a transmit time slot for a TDMA burst.

FIG. 1 illustrates a transmit time slot for a TDMA burst 100. The transmit time slot 100 includes both ramp-up and ramp-down periods 110, 112, during which periods a transmitter's power amplification is gradually increased and then gradually decreased. During the modulation period 114, the transmitter carrier signal is modulated with applied data. The ramp-up and ramp-down periods 110, 112 are critical during the control of the transmitter's power transition so as to prevent frequency spreading. Thus, in a TDMA system, the power control loop must be slow enough so that the modulation's amplitude variations are not adversely affected, but fast enough so that the power ramp-up and ramp-down times are not excessive.

Figure 2:
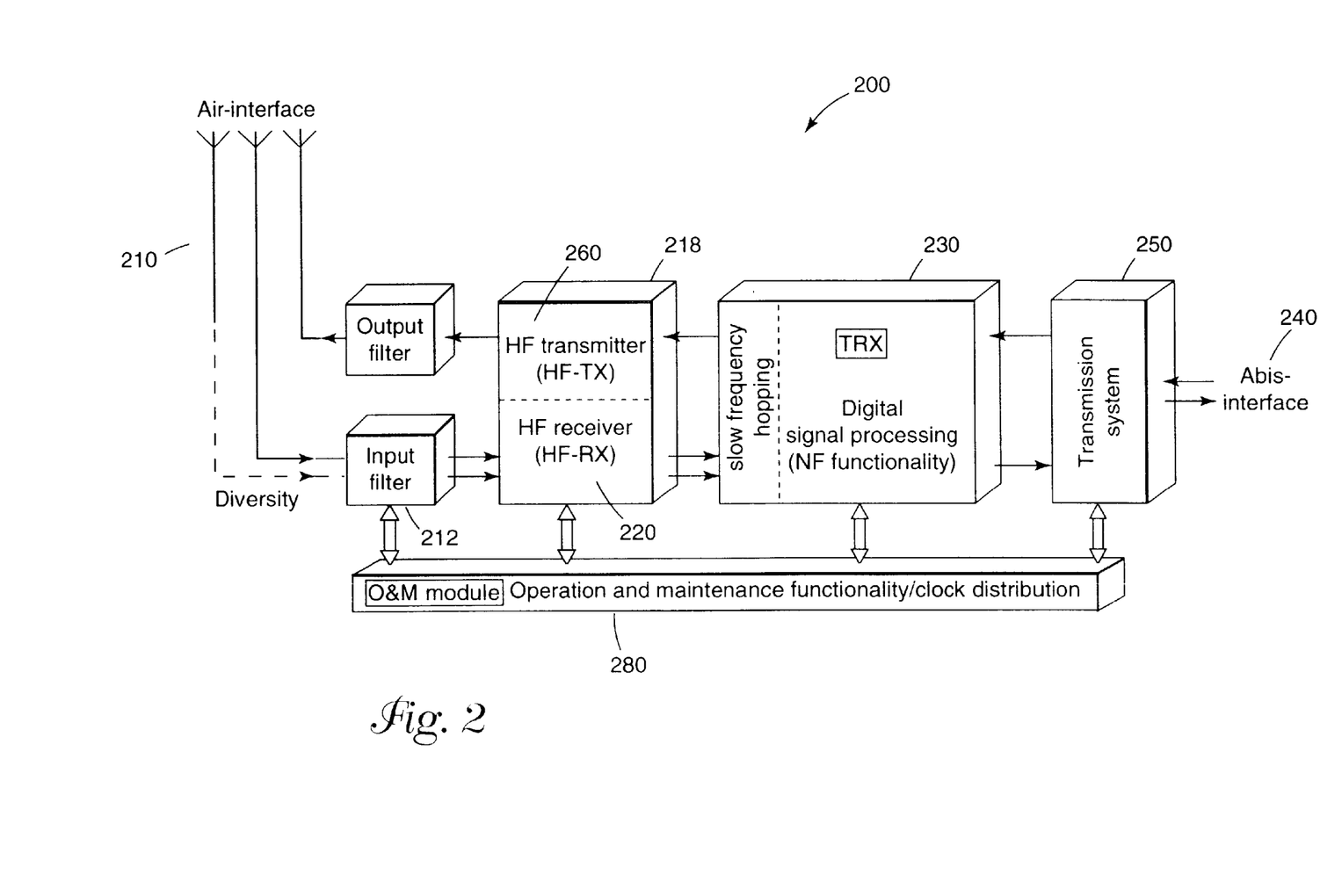
FIG. 2 illustrates a block. diagram of a base transceiver system.

FIG. 2 illustrates a block diagram of a base transceiver system 200. In FIG. 2, the base transceiver system receives transmission bursts via the air interface 210 which are filtered in an input filter 212. A transceiver 218 provides a high frequency receiver 220 and a high frequency transmitter 260. The signal from the input filter 212 is processed by a high frequency receiver 220 and then processed by digital signal processors in a transmitter/receiver module 230. The transceiver/receiver module 230 consists of a low frequency part for digital signal processing and a high frequency part for modulation and demodulation. These process signals are then provided to the Abis interface 240 via transmission system 250. Signals from the Abis interface 240 are received at the transmission system 250 and then forwarded to the transmitter/receiver module 230. The signals are then processed and provided to the high frequency transmitter 260 which are filtered by the output filter 270 and sent out over the air interface 210 to mobile stations (not shown). An operations and maintenance module 280 may be provided to administer the functionality of the base transceiver system and to provide clock distribution.

Figure 3:
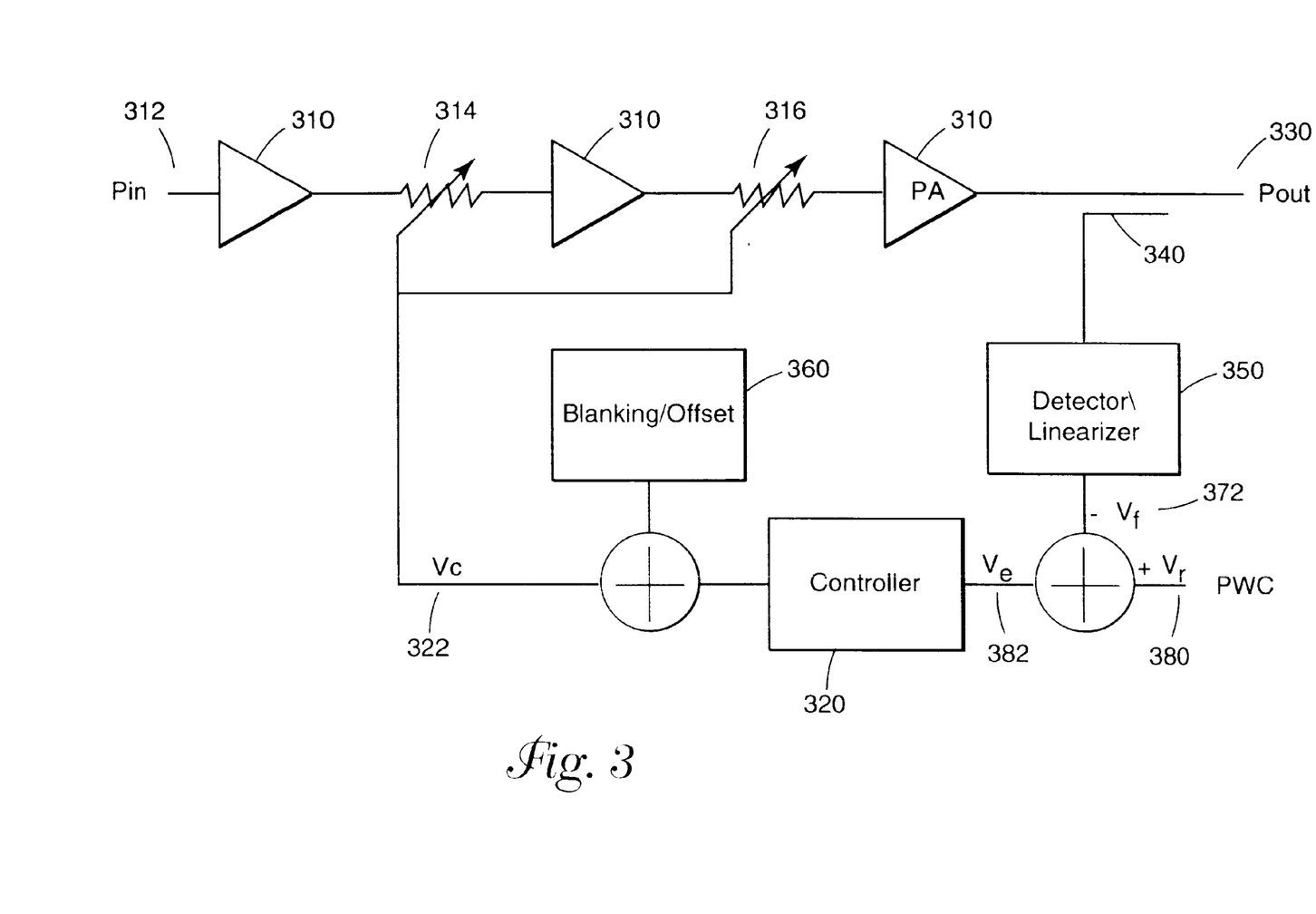
FIG. 3 illustrates a power control loop such as may be used in the transceiver illustrated in FIG. 2.

FIG. 3 illustrates a power control loop 300 such as may be used in the transceiver 218 illustrated in FIG. 2. In FIG. 3, a series of power amplifiers 310 receive the input signal 312. Power control via PIN diode attenuators 314, 316 under control of the loop controller 320 ensure a proper power level for the output signal 330. A directional coupler 340 samples the output signal 330 and a detector/linearizer 350 produces a voltage 372, $V_f$. A reference voltage 380, $V_r$, is generated, wherein the voltage waveform of the reference voltage 380 is selected such that the switching spectrum will meet the GSM specifications. The filter output voltage 372, $V_f$, is compared with the reference voltage 380, $V_r$, and an output error voltage 382, $V_e$, is sent to the controller 320 to produce a control signal $V_C$ 322 for controlling the PIN diode attenuators 314, 316. The control signal 322 may also be adjusted for blanking and offset 360.

Eventually, the control loop 300 causes the error voltage 382 to be zero or close to zero. Accordingly, the control signal 322 is a ramp function and is synchronized with the reference voltage 380. Typically, the reference voltage 380 is a raised cosine signal. However, a raised cosine signal has been proven to be insufficient in some applications. A different reference signal, e.g., the Blackman window signal, may therefore be preferred.

A function of the power control loop 300 is to control the transient response, ramping-up or ramping-down, within 14 microseconds regardless of the variation of gain, temperature, and many other variables. Of course, this control loop 300 has to be stable under any condition, e.g. temperature, power level, etc.

In a GSM application, the modulation and power switching spectra can produce significant interference in the adjacent channels. Hence, the output RF spectrum test is broken into two parts: a modulation test and a transient test. The modulation test averages the peaks of the data stream over a number of timeslots, while the transient test averages the peaks of the power-ramp-up and power-ramp-down portion of the burst. Table 1 illustrates the GSM specifications for transient response.

In Table 1, the power switching transient spectrum for GSM 900 and DCS 1800 are illustrated for three offsets.

TABLE 1

| Offset (kHz): | Power (dBc):GSM 900 | Power (dBc):DCS 1800 |
|---|---|---|
| 400 | −57 | −50 |
| 600 | −67 | −58 |
| 1200 | −74 | −66 |

As can be seen from Table 1, sudden changes in magnitude will induce higher frequency components and result in interference with other channels. The level of interference is dependent on the transient waveform or so called 'window'. In digital signal processing, if the sampling time is finite it can be thought as imposing a window onto the input signal and only the signal in the window will be processed. For a rectangular window, the first side lobe is 13 dBc below the main lobe.

Figure 4A:
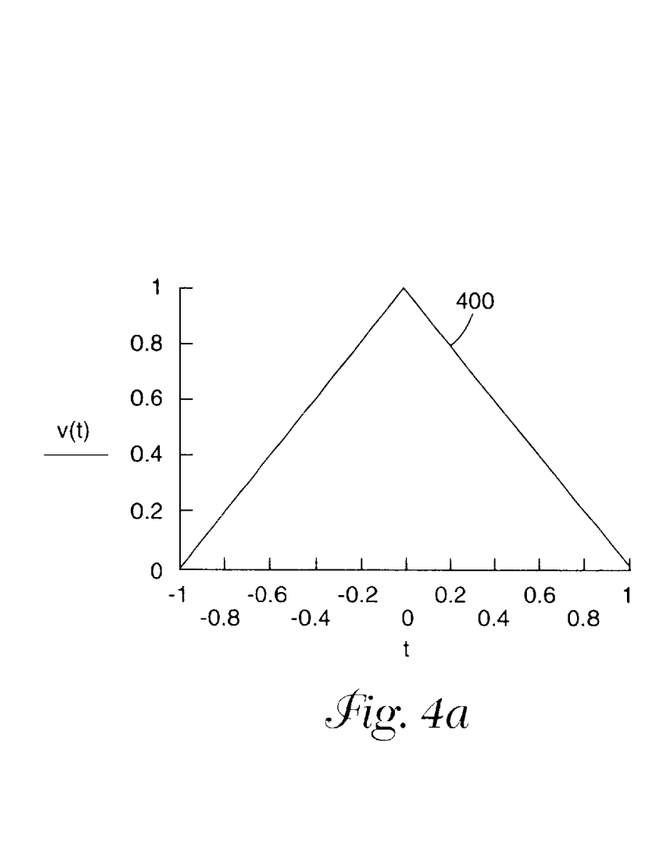
FIG. 4a illustrates a triangle window (Barlett window)
Figure 4B:
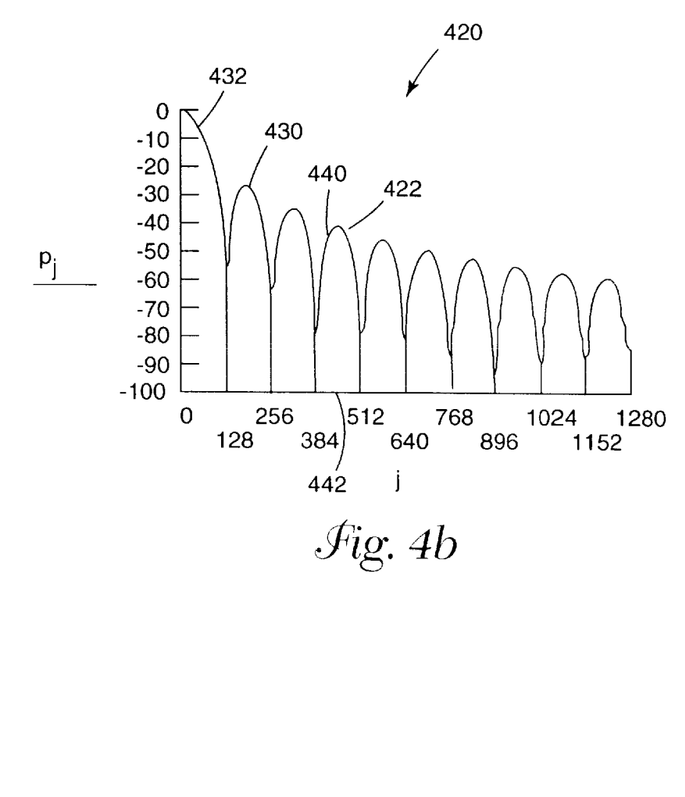

FIG. 4a illustrates a triangle window 400 (Barlett window). FIG. 4b illustrates the resulting RF spectrum 420 including the side lobes 422. From FIG. 4b, the first side lobe 430 is 27 dBc below the main lobe 432 and is −45 dBc 440 at 400 kHz offset 442, where the transient is set to 10 microseconds for both rise and fall time.

Of particular importance is the desired output voltage at the required offset frequency. Accordingly, only the rise and fall waveform needs to be fed a Fast Fourier Transform (FFT), instead of the whole burst. If the whole burst (570 microsecond) is fed to FFT, then the main lobe 432 is increased by 20 log (number of sampled points in the burst) dB. Thus, the dBc needs to be corrected with this number, i.e., the analysis of the TDMA burst transient is exactly the same as the analysis of windows in digital signal processing.

Figure 5A:
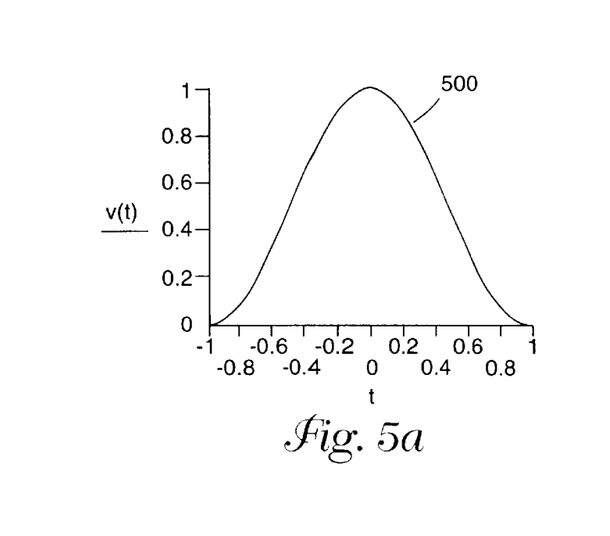
FIG. 5a shows a Hanning window (raised cosine)
Figure 5B:
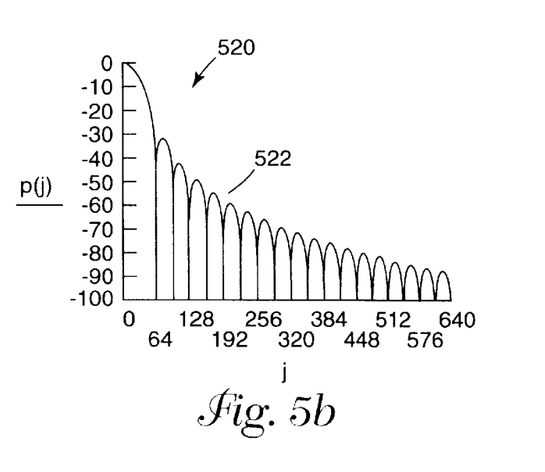
Figure 6A:
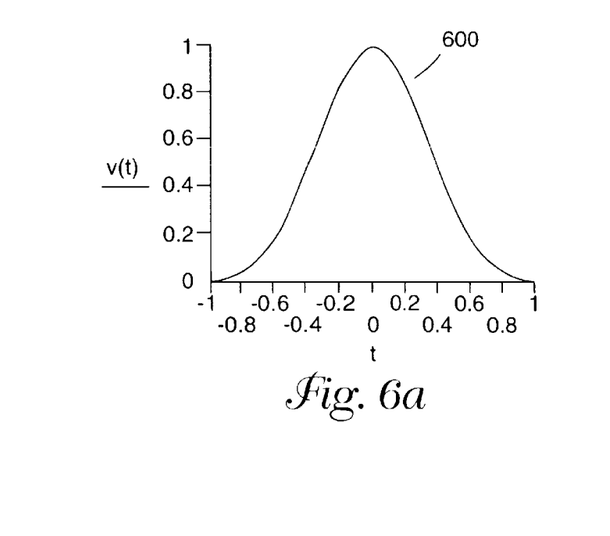
FIG. 6a shows a Blackman window.
Figure 6B:
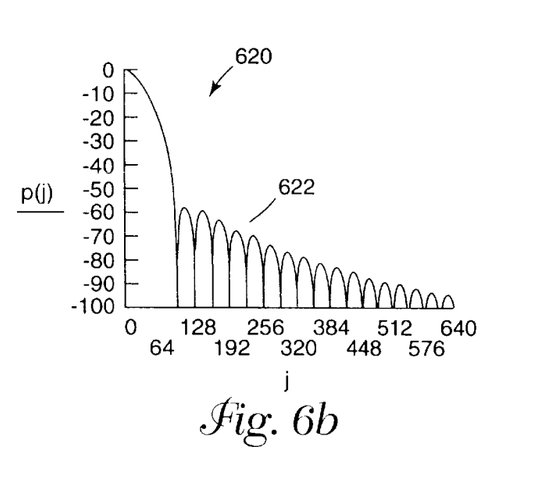

FIG. 5a shows a Hanning window 500 (raised cosine) and FIG. 5b illustrates the resulting spectra 520 from using the Hanning window 500. FIG. 6a shows a Blackman window 600 and FIG. 6b illustrates the resulting spectra 620 from using the Blackman window 600. The rise time and fall times are set to 10 microseconds. Comparing FIGS. 5b and 6b, it is obvious that the Blackman window 600 of FIG. 6a provides lower side lobes 622 than the side lobes 522 of the Hanning window 500 of FIG. 5a.

A window must be selected for providing the minimum switching transient spectra. The close loop power control range should be around 45 dB, but the total dynamic range could be more than 80 dB. Because of this wide dynamic range, 1 to 5 microseconds out of 15 microseconds is used to ramp-up (open loop control) before the 45 dB close loop power control. The problem is then how to effectively utilized these 15 microseconds to meet the GSM specification as shown in table 1 and still allow margin for production.

Figure 7A:
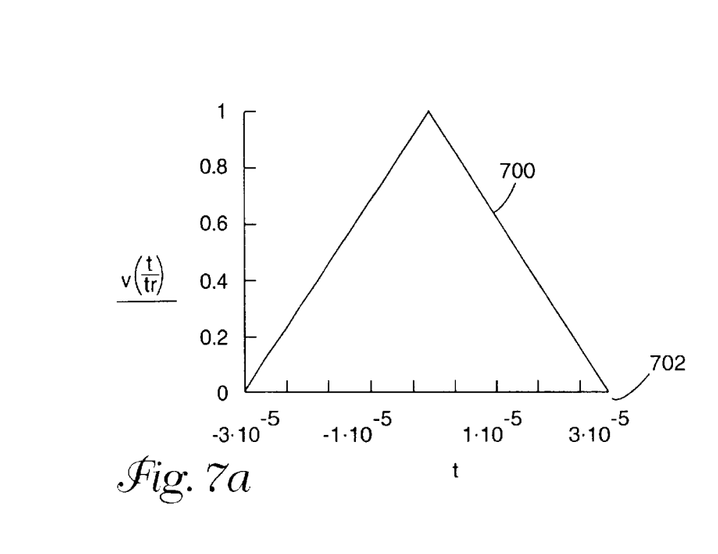
FIG. 7a illustrates a Barlett window.
Figure 7B:
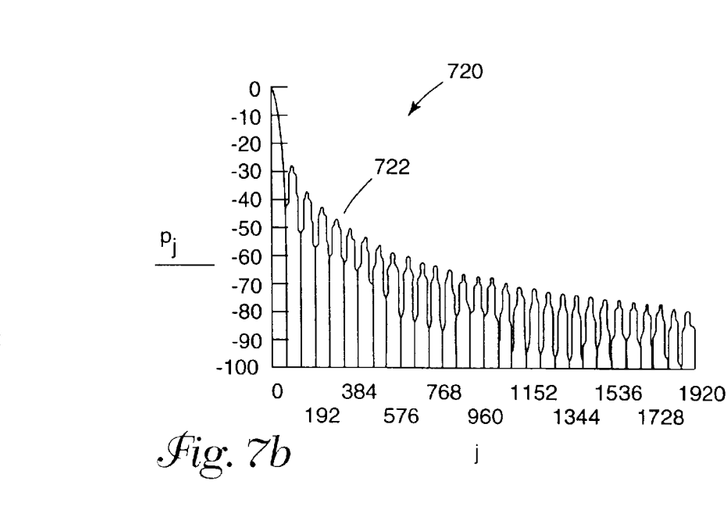
FIG. 7b shows the spectra including the side lobes resulting from the use of the Barlett window of FIG. 7a and demonstrates that 30 microseconds is needed for Barlett window.

FIG. 7a illustrates a Barlett window 700 and FIG. 7b is the spectra 720, including the side lobes 722. FIG. 7a demonstrates that a rise and fall time of 30 microseconds 702 is needed for Barlett window. However, this is too much time.

Figure 8A:
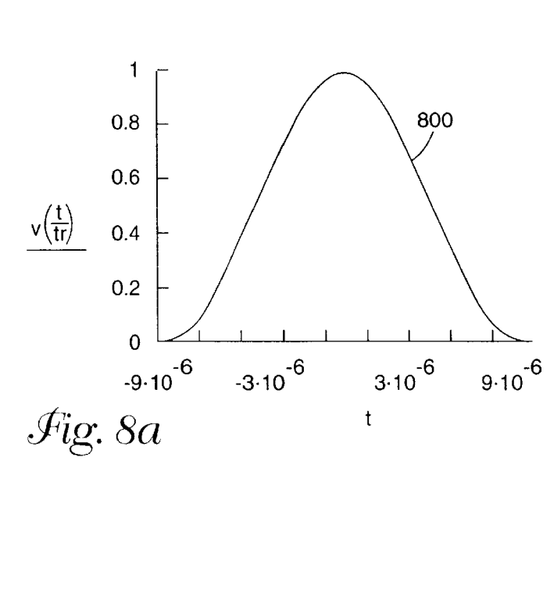
FIG. 8a illustrates a Hanning window.
Figure 8B:
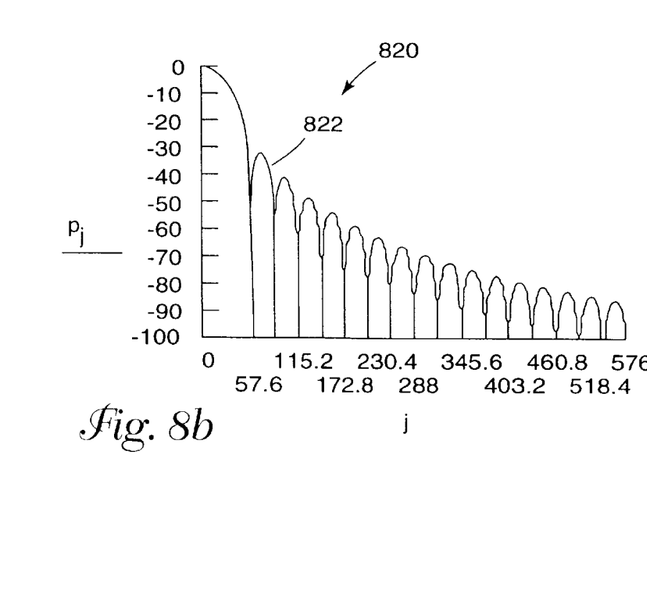
FIG. 8b shows the spectra including the side lobes resulting from the use of the Hanning window of FIG. 8a and demonstrates that 9 microseconds are needed for the Hanning window.

FIG. 8a illustrates a Hanning window and FIG. 8b is the spectra 820, including the sidelobes 822. FIG. 8a shows that 9 microseconds 802 are needed for the Hanning window (raised cosine).

Figure 9A:
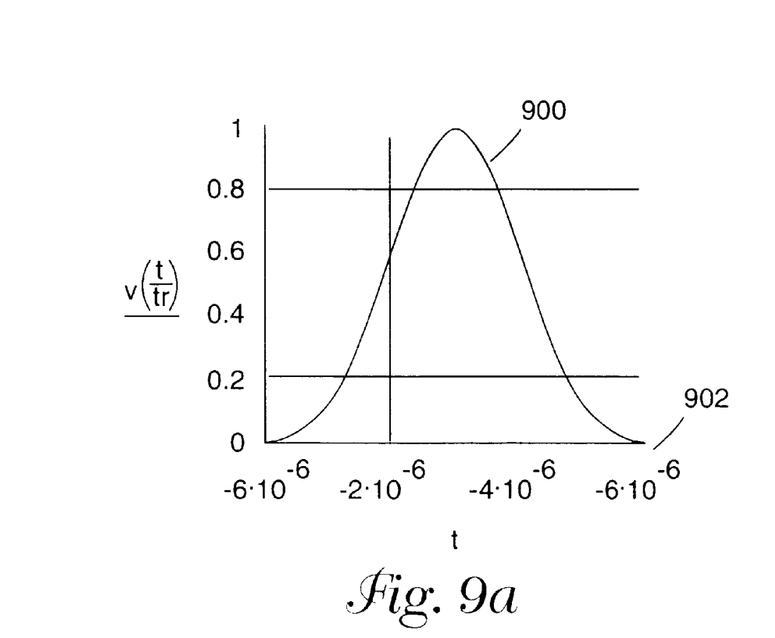
FIG. 9a illustrates the Blackman window.
Figure 9B:
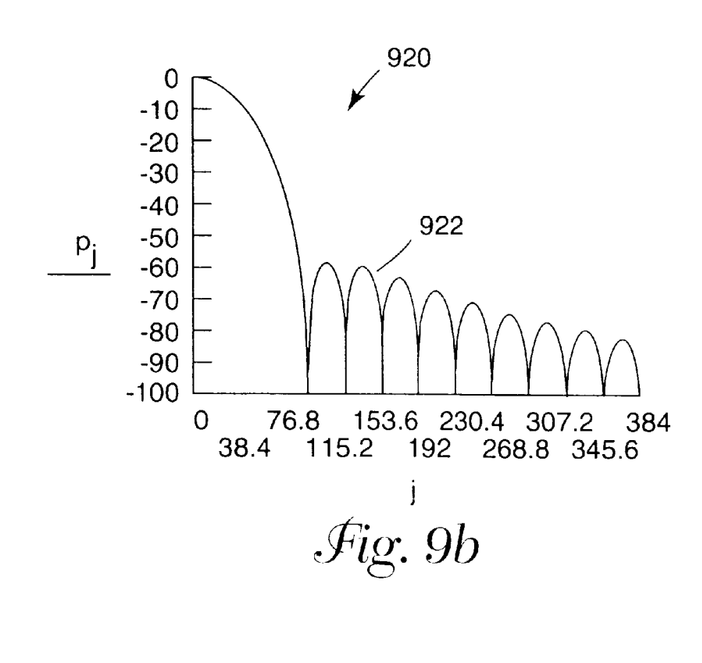
FIG. 9b shows the spectra including the side lobes resulting from the use of the Blackman window of FIG. 9a and demonstrates that only 6 microseconds are needed.

Finally, FIG. 9a illustrates the Blackman window 900 and FIG. 9b is the spectra 920, including the side lobes 922. FIG. 9a shows that only 6 microseconds 902 are needed. Accordingly, the Blackman window 900 is preferred over the other windows.

The loop bandwidth and stability are dependent upon the AC small signal gain (β). Specifically, β is the ratio between an incremental change in the detected voltage ($dV_f$) due to an incremental change in the control voltage ($dV_c$) to the PIN diode attenuator. Accordingly, $$\beta = \frac{dV_f}{dV_C} = \frac{dV_f}{dP_{out}} \cdot \frac{dP_{out}}{dV_C} \qquad \text{Equation 1}$$

where $P_{out}$ is the power into the detector diode and is expressed as:

$$P_{out} = P_{in} \cdot G \cdot m \cdot (V_C - V_{offset})^4 \qquad \text{Equation 2}$$

when two voltage linear attenuators are used in the loop. $V_{offset}$ is the cut in voltage of the attenuators. The coupling factor of the directional coupler is included in the overall gain G.

For a linear detector, the relationship of power to voltage is $v_f = k_d \cdot (Pout)^{1/2}$. In other words:

$$\frac{dV_f}{dP_{out}} = \frac{k_d}{2} \cdot \frac{1}{\sqrt{P_{out}}}$$ Equation 3

$$\frac{dP_{out}}{dV_C} = 4 \cdot P_{in} \cdot G \cdot m \cdot V_C^3$$

$$= 4 \cdot (P_{in} \cdot G \cdot m)^{\frac{1}{4}} \cdot (P_{in} \cdot G \cdot m \cdot V_C^4)^{\frac{3}{4}}$$

$$= 4 \cdot (P_{in} \cdot G \cdot m)^{\frac{1}{4}} \cdot (P_{out})^{\frac{3}{4}}$$

$$\beta = 2 \cdot k_d \cdot (P_{in} \cdot G \cdot m)^{\frac{1}{4}} \cdot (P_{out})^{\frac{1}{4}}$$

The loop bandwidth of the loop becomes $\beta/T_1$ for a type 1 controller and $(Av \cdot \beta)/T_2$ for a type 0 controller, where Av is the gain of the loop amplifier, $T_1$ is the integrator time constant of the Type 1 controller and $T_2$ is the integrator time constant of the Type 0 controller. The loop bandwidth is not a constant. Instead, the loop bandwidth changes with the power level: the higher the power levels, the greater the bandwidth.

Table 2 illustrates that the loop bandwidth can vary by a factor of 15 at 50 dB below the maximum carrier power.

TABLE 2

| Pout | $\sqrt[4]{Pout}$ |
|---|---|
| 50 W | 2.66 |
| 0.005 (30 dBc) | 0.473 |
| 0.0005 (40 dBc) | 0.266 |
| 0.00005 (50 dBc) | 0.15 |

This can impose a problem of power ramping because the loop is not going to follow the reference signal, especially in the lower power regions.

Figure 10:
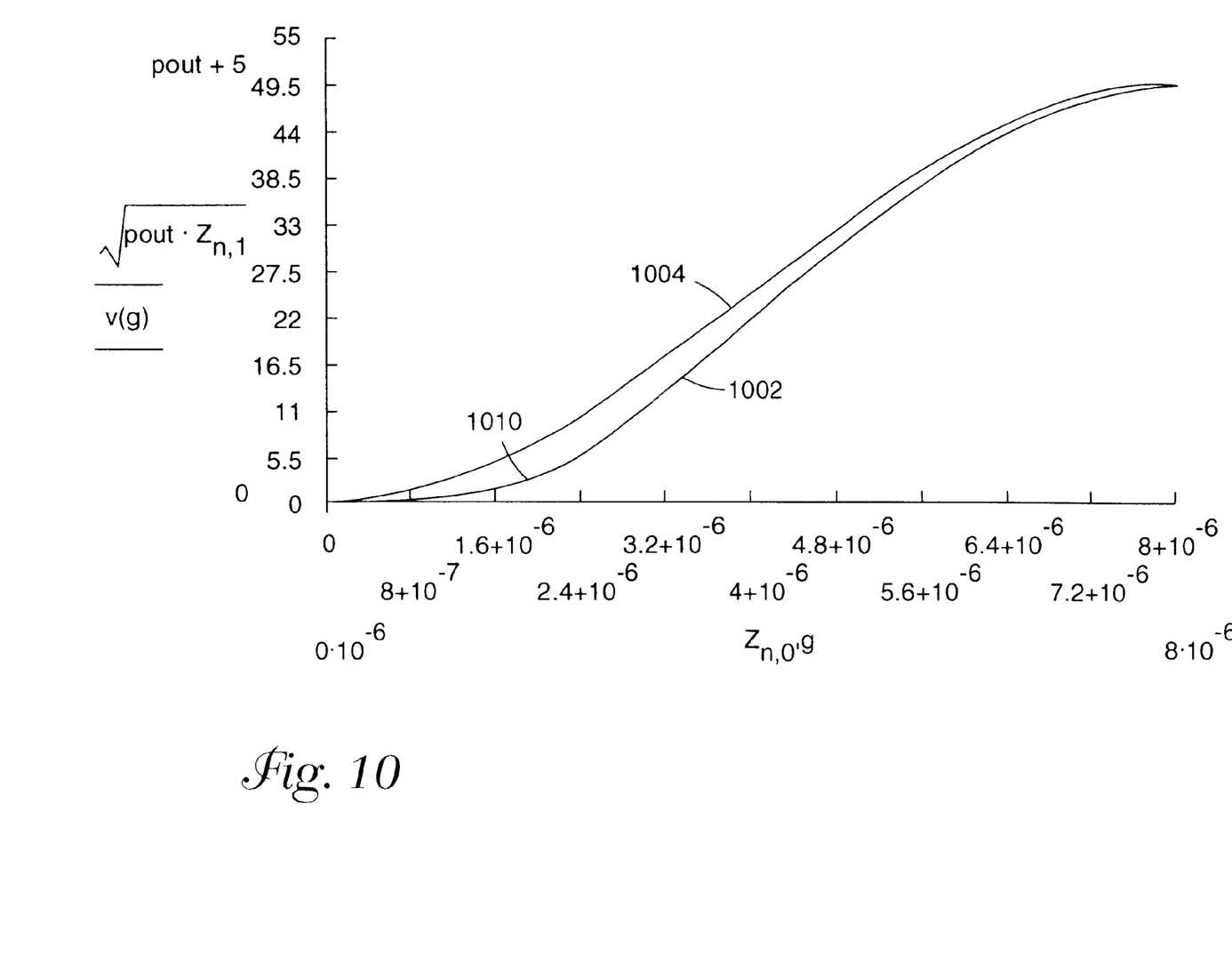
FIG. 10 illustrates a plot of the ramping performance of the power control loop.

By solving the loop differential equations, a plot of the ramping performance 1000 may be obtained as illustrated in FIG. 10. FIG. 10 shows a comparison of the output power 1002 and the square of the raised cosine signal 1004. The ramping of a typical power control loop is very sluggish in the beginning 1010. This matches the above statements concerning the loop bandwidth. In FIG. 10, the bandwidth of the loop decreases as the power decreases, so at the first few microseconds the output power will not follow closely to the reference voltage which could deteriorate the switching transient spectral because, as mentioned above, the output power needs time for the signal to meet the spectral specifications.

Figure 11:
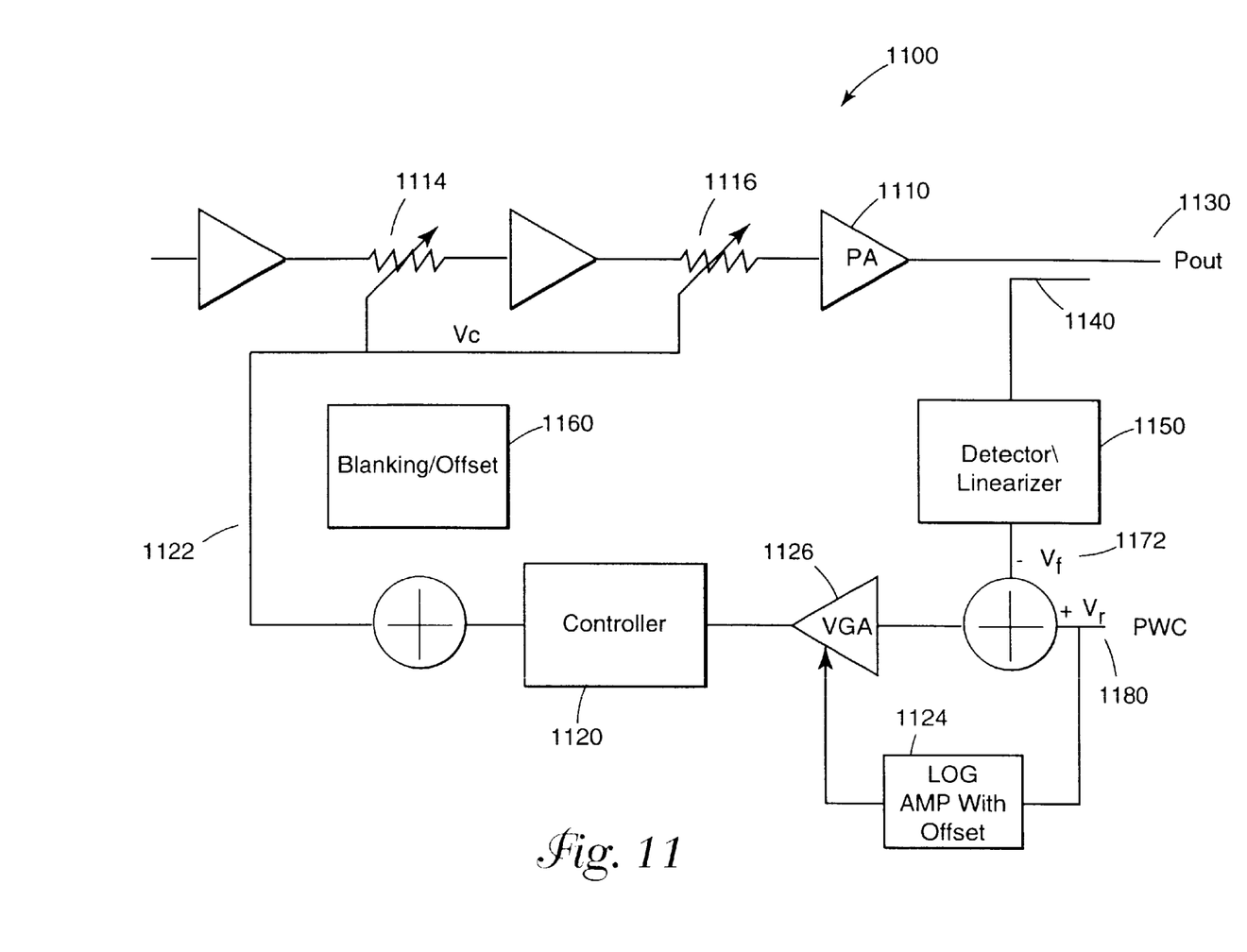
FIG. 11 illustrates a power control loop according to the present invention.

FIG. 11 illustrates a power control loop 1100 according to the present invention. To provide an input to the controller 1120 of the power control loop 1100 of FIG. 11, a gain controller 1124, such as a logarithmic amplifier, is used to control a variable gain amplifier (VGA) 1126. The gain controller 1124 receives the signal $V_r$ 1180 and controls the gain of the VGA. The output voltage of the controller 1120 is then used to control the PIN diode attenuators 1114, 1116. Eventually, the two voltages $V_f$ 1172 and $V_r$ 1180 will become equal.

Knowing the gain and the $P_{in}$ variation during temperature change and aging is also important. For example, if the gain increased by 12 dB, then the loop bandwidth can change by a factor of 2. Without taking this into consideration, the loop could oscillate at some point in the future or at cold temperatures. If the gain decreases by 12 dB, there is no risk of oscillation, but the waveform will be distorted.

The AC gain, $dV_f/dV_C$, in the VGA power control loop is expressed as:

$$\beta = 2 \cdot k_d \cdot (P_{in} \cdot G \cdot m)^{1/4} \cdot (P_{out})^{1/4} \cdot Av,$$ Equation 4 where Av is the gain of the VGA. If Av is set to be equal to $(P_{out})^{-1/4}$, then the loop bandwidth is no longer related to the power level. The reference signal is related to the power level as:

$$V_f = k_d \cdot (P_{out})^{1/2}$$ Equation 5

$$(P_{out})^{-1/4} = k_d^{1/2} \cdot V_f^{-1/2}$$

provided a dB linear VGA with gain equals to $40 \cdot V_g + 10$ (dB), where $V_g$ is the control voltage to the VGA. In magnitude, this is $Av = 10^{2 \cdot Vg + 0.5}$. Equating $Av = (P_{out})^{-1/4}$ in terms of $V_f$ and $V_g$:

$$k_d^{1/2} \cdot V_f^{-1/2} = 10^{2 \cdot Vg + 0.5}.$$ Equation 6

Taking the natural log of both sides, the solution of the control signal Vg is found to be:

$$Vg = \frac{\ln(V_f)}{-9.21} + 0.31$$ Equation 7

Figure 12:
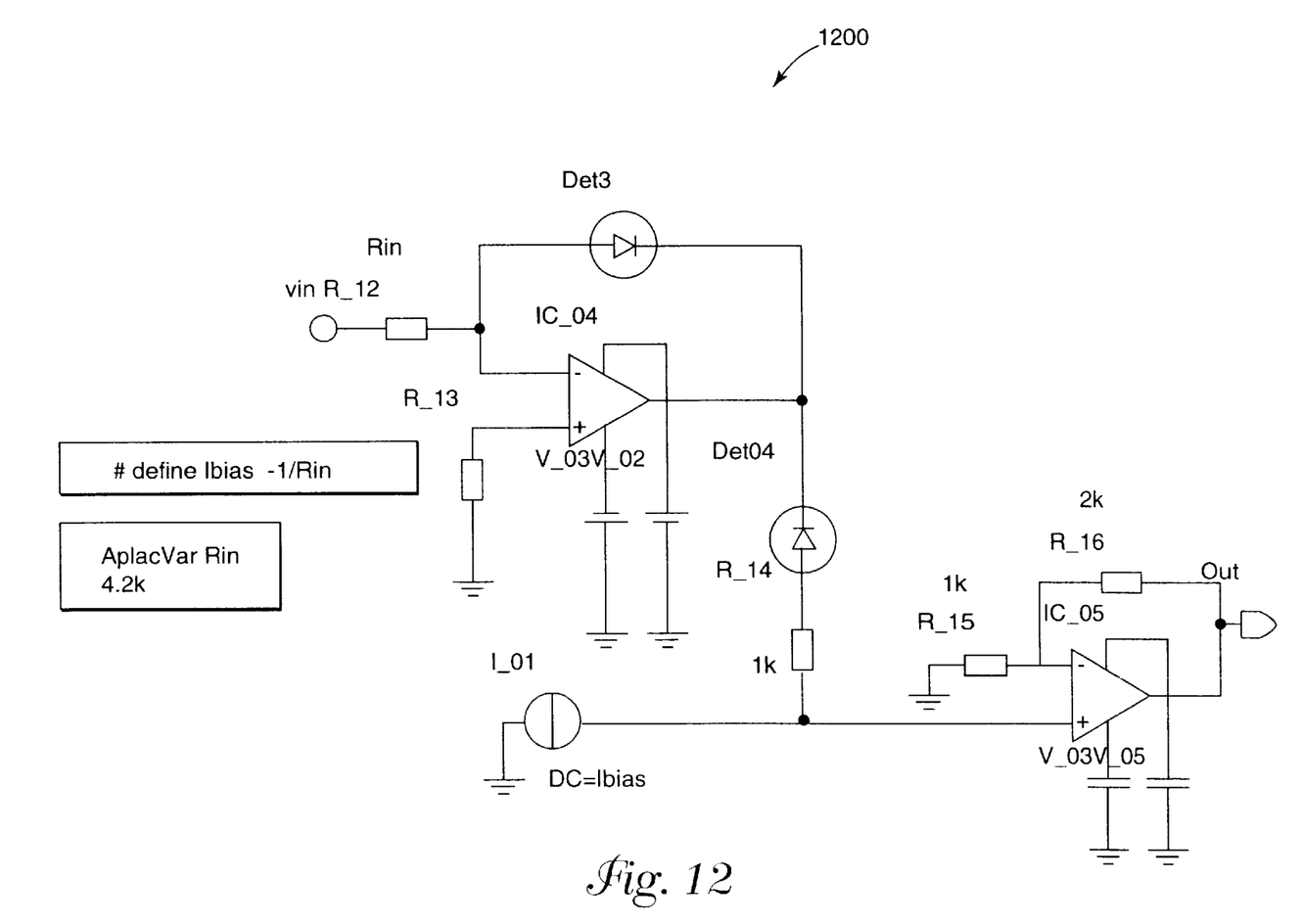
FIG. 12 illustrates one implementation of a variable gain amplifier as used in a power control loop according to the present invention.

FIG. 12 illustrates one implementation of a VGA 1200 that may be used in a power control loop according to the present invention. In FIG. 12, the gain of the VGA 1200 is set to be equal to $(P_{out})^{-1/4}$ so the loop bandwidth of the power control loop is no longer related to the power level.

In summary, a method for reducing adjacent channel interference in a ramp-up and a ramp-down of a signal burst in a cellular communication system has been disclosed. A gain controller, such as a logarithmic amplifier, controls the ramp-up and the ramp-down of the gain of a variable gain amplifier so that a lower loop bandwidth is increased to increase a loop speed and an upper loop bandwidth is decreased to increase a loop stability for the power control loop. Thus, the loop bandwidth is not dependent upon the power level of the sampled output signal.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A base station, comprising:

input and output filters for filtering signals received and transmitted via an air interface to a mobile station;

a transceiver, coupled to the input and output filters, for receiving filtered signals from the input filter and for transmitting signals to the output filter;

a processor, couple to the transceiver, for providing digital signal processing to signals provided to and received from the transmitter;

a transmission system, coupled to the processor, for providing an interface between the processor and an Abis interface; and an operation and maintenance unit, coupled to at least the transceiver and the processor, to administer the functionality of at least the transceiver and the processor and to provide clock distribution to at least the transceiver and the processor;

wherein the transceiver further comprises a power control loop for reducing adjacent channel interference in a ramp-up and a ramp-down of a signal burst generated by the base station, the power control loop including a loop bandwidth and further comprising:
   a first amplifier for receiving an input signal and generating a power output signal in response thereto;
   a coupler for sampling the power output signal;
   a detector/linearizer circuit, coupled to the coupler, for generating a voltage signal;
   a comparator, coupled to the detector/linearizer circuit, for receiving the voltage signal and comparing the voltage signal to a reference signal to generate an error signal;
   a variable gain amplifier, coupled to the comparator, having a selectable gain, the variable gain amplifier receiving the error signal to produce a controller input signal according to the gain;
   a gain controller, coupled to the variable gain amplifier, for ramping the gain of the variable gain amplifier by processing the reference signal; and
   a controller, coupled to the variable gain amplifier, the controller receiving the controller input signal and generating a control signal to control attenuation of the input signal to the first amplifier, wherein the ramping of the gain of the variable gain amplifier provides a constant loop bandwidth of the power control loop without regard to the power level of the sampled power output signal.

2. The base station of claim 1 wherein the ramping of the gain of the variable gain amplifier causes a decrease to an upper loop bandwidth of the power control loop and an increase to a lower loop bandwidth of the power control loop.

3. The base station of claim 2 wherein the ramping of the gain of the variable gain amplifier lowers bandwidth variation of the power control loop to decrease adjacent channel interference.

4. The base station of claim 2 wherein the ramping of the gain of the variable gain amplifier is synchronized with the reference signal.

5. A power control loop for reducing adjacent channel interference in a ramp-up and a ramp-down of a signal burst in a cellular communication system, the power control loop having a loop bandwidth and further comprising:
   a first amplifier for receiving an input signal and generating a power output signal in response thereto;
   a coupler for sampling the power output signal;
   a detector/linearizer circuit, coupled to the coupler, for generating a voltage signal;
   a comparator, coupled to the detector/linearizer circuit, for receiving the voltage signal and comparing the voltage signal to a reference signal to generate an error signal;
   a variable gain amplifier, coupled to the comparator, having a selectable gain, the variable gain amplifier receiving the error signal to produce a controller input signal according to the gain;
   a gain controller, coupled to the variable gain amplifier, for ramping the gain of the variable gain amplifier by processing the reference signal; and
   a controller, coupled to the variable gain amplifier, the controller receiving the controller input signal and generating a control signal to control attenuation of the input signal to the first amplifier, wherein the ramping of the gain of the variable gain amplifier provides a constant loop bandwidth of the power control loop without regard to the power level of the sampled power output signal.

6. The power control loop of claim 5 wherein the ramping of the gain of the variable gain amplifier causes a decrease to an upper loop bandwidth of the power control loop and an increase to a lower loop bandwidth of the power control loop.

7. The power control loop of claim 6 wherein the ramping of the gain of the variable gain amplifier lowers bandwidth variation of the power control loop to decrease adjacent channel interference.

8. The power control loop of claim 6 wherein the ramping of the gain of the variable gain amplifier is synchronized with the reference signal.

9. A method for controlling a power control loop, comprising:
   sampling a power output signal of a first amplifier to produce a sample signal;
   comparing the sample signal to a reference signal;
   generating an error signal based upon the comparison;
   providing the error signal to a variable gain amplifier;
   ramping a gain of the variable gain amplifier by processing the reference signal; and
   producing a control signal for controlling the attenuation of the signal to the first amplifier in response to a controller input signal, wherein the ramping of the gain of the variable gain amplifier provides a constant loop bandwidth of the power control loop without regard to the power level of the sampled power output signal.

10. The method of claim 9 wherein the ramping of the gain of the variable gain amplifier causes a decrease to an upper loop bandwidth of the power control loop and an increase to a lower loop bandwidth of the power control loop.

11. The method of claim 10 wherein the ramping lowers loop bandwidth variation to decrease adjacent channel interference.

12. The method of claim 10 wherein the ramping of the gain of the variable gain amplifier is synchronized with the reference signal.

13. A method for reducing adjacent channel interference in a ramp-up and a ramp-down of a signal burst in a cellular communication system having a power control loop controlling the ramp-up and the ramp-down within a predetermined bandwidth, the method comprising:
   sampling a reference signal and processing the reference signal to set a gain of a feedback loop amplifier in the power control loop, the setting of the gain of the feedback loop amplifier using the reference signal increasing a lower loop bandwidth to increase a loop speed and decreasing an upper loop bandwidth to increase a loop stability for the power control loop.

14. The method of claim 1 wherein the increasing the lower loop bandwidth and decreasing the upper loop bandwidth lowers loop bandwidth variation to decrease adjacent channel interference.

* * * * *